US012716956B2

(12) United States Patent
Yun

(10) Patent No.: US 12,716,956 B2
(45) Date of Patent: Aug. 25, 2026

(54) METHOD AND APPARATUS FOR ESTIMATING AGING OF SATELLITE BATTERY

(71) Applicant: KOREA AEROSPACE RESEARCH INSTITUTE, Daejeon (KR)

(72) Inventor: Seok-Teak Yun, Daejeon (KR)

(73) Assignee: KOREA AEROSPACE RESEARCH INSTITUTE, Daejeon (KR)

( * ) Notice: Subject to any disclaimer, the term of this patent is extended or adjusted under 35 U.S.C. 154(b) by 498 days.

(21) Appl. No.: 18/328,917

(22) Filed: Jun. 5, 2023

(65) Prior Publication Data

US 2023/0408599 A1 Dec. 21, 2023

(30) Foreign Application Priority Data

Jun. 16, 2022 (KR) ........................ 10-2022-0073758
May 11, 2023 (KR) ........................ 10-2023-0061346

(51) Int. Cl.
*G01R 31/392* (2019.01)
*G01R 31/367* (2019.01)
*G01R 31/3835* (2019.01)

(52) U.S. Cl.
CPC ......... *G01R 31/392* (2019.01); *G01R 31/367* (2019.01); *G01R 31/3835* (2019.01)

(58) Field of Classification Search
CPC .................................................... G01R 31/392
See application file for complete search history.

(56) References Cited

U.S. PATENT DOCUMENTS

2007/0222418 A1* 9/2007 Le Gall ............. H01M 10/4207 320/136
2009/0243540 A1* 10/2009 Choi ................. H02J 7/007194 320/150
2011/0060538 A1* 3/2011 Fahimi ................ G01R 31/392 702/63
2012/0188372 A1* 7/2012 Ozkul .................... G01C 11/02 348/E7.085
2015/0226812 A1 8/2015 Gajewski et al.
2019/0310321 A1 10/2019 Mi et al.
(Continued)

FOREIGN PATENT DOCUMENTS

KR 20130060623 6/2013
KR 20180064220 6/2018
(Continued)

*Primary Examiner* — Oluseye Iwarere
(74) *Attorney, Agent, or Firm* — Perman & Green, LLP

(57) ABSTRACT

A method for estimating an aging amount of a battery mounted on a satellite includes receiving battery voltage and current data generated by detecting a voltage and current of the battery in a preset first sensing period during a precise sensing period, determining a mission start time point based on the battery current data, obtaining a first battery voltage value of a first time point based on the battery voltage data and the mission start time point, obtaining a second battery voltage value of a second time point when a preset reference time elapses from the first time point based on the battery voltage data, and estimating the aging amount of the battery based on a sensing voltage difference between the first battery voltage value and the second battery voltage value, a first reference voltage difference, and a second reference voltage difference.

9 Claims, 6 Drawing Sheets

(56) References Cited

U.S. PATENT DOCUMENTS

2020/0200683 A1* 6/2020 Aronov ................. G06T 7/0012
2022/0200311 A1* 6/2022 Oonishi .................. H02J 7/342
2022/0244315 A1 8/2022 Yang et al.
2023/0393215 A1* 12/2023 Bao ...................... G01R 31/367

FOREIGN PATENT DOCUMENTS

KR 102261736 6/2021
WO WO-2013016188 A1 * 1/2013 ........... G01R 31/389
WO 2014029647 2/2014

* cited by examiner

METHOD AND APPARATUS FOR ESTIMATING AGING OF SATELLITE BATTERY

CROSS-REFERENCE TO RELATED APPLICATION

This application is based on and claims priority under 35 U.S.C. § 119 to Korean Patent Application No. 10-2022-0073758, filed on Jun. 16, 2022, in the Korean Intellectual Property Office, and Korean Patent Application No. 10-2023-0061346, filed on May 11, 2023, in the Korean Intellectual Property Office, the disclosure of which is incorporated by reference herein in its entirety.

BACKGROUND

1. Field

The disclosure relates to a method and apparatus for estimating an aging amount of a satellite battery, and more particularly, to a method and apparatus for estimating an aging amount of a battery mounted on a satellite that performs a satellite mission.

2. Description of the Related Art

A satellite system is a system using an artificial satellite orbiting the earth and includes a ground station and an artificial satellite. The ground station may wirelessly communicate with artificial satellites (hereinafter, referred to as 'satellites'), and the satellite may perform a satellite mission according to a command of the ground station. In detail, the ground station may transmit a command signal for controlling the satellite to the satellite, and the satellite may receive the command signal by using a transponder receiver, may perform various types of missions such as weather, marine, global environment, and space environment observation, reconnaissance, etc. according to a command of the ground station, and may transmit data according to the execution of the missions to the ground station. A current satellite system operates satellites for various purposes such as next-generation medium-sized satellites, multi-purpose practical satellites, and geostationary complex satellites.

A satellite may include a satellite body and a battery. The battery is charged by receiving power generated from a solar panel when the satellite is located in a daylight period where the sun shines on the satellite. The power charged to the battery is supplied to the satellite to drive the satellite when the satellite is located in an eclipse period where the sun does not shine on the satellite or when power generated from solar energy is seasonally insufficient. Accordingly, a lifespan of the satellite performing a mission depends on a lifespan of the battery, and the battery of the satellite is one of the very important components in operating the satellite.

Although satellites are manufactured considering a space environment in which they are actually operated, actual manufacturing and testing are performed on the ground. The battery may be overcharged or overdischarged due to a difference between a manufacturing and testing environment and an actual operating environment and other factors, and as time passes, the battery gradually ages and its lifespan decreases. Because aging of a satellite battery greatly affects a lifespan of a satellite and aging estimation of the satellite battery in orbit is important for a battery capacity variation and maximum mission design, a technology for accurately estimating a degree of aging of a satellite battery has been developed.

SUMMARY

The disclosure provides a method of estimating an aging amount of a battery mounted on a satellite that performs a satellite mission.

The disclosure provides an apparatus for estimating an aging amount of a battery mounted on a satellite that performs a satellite mission.

Additional aspects will be set forth in part in the description which follows and, in part, will be apparent from the description, or may be learned by practice of the presented embodiments.

According to an aspect of the disclosure, a method of estimating an aging amount of a battery mounted on a satellite that performs a satellite mission includes receiving battery voltage and current data generated by detecting a voltage and current of the battery in a preset first sensing period during a precise sensing period, determining a mission start time point when the satellite begins to perform the satellite mission based on the battery current data, obtaining a first battery voltage value of a first time point immediately before the satellite performs the satellite mission based on the battery voltage data and the mission start time point, obtaining a second battery voltage value of a second time point when a preset reference time elapses from the first time point based on the battery voltage data, and estimating the aging amount of the battery of the satellite based on a sensing voltage difference that is a difference between the first battery voltage value and the second battery voltage value, a first reference voltage difference, and a second reference voltage difference.

The precise sensing period may include a satellite mission execution period in which the satellite performs the satellite mission.

The satellite may perform the satellite mission by using a payload for capturing an image including at least one of an electro-optical (EO) payload, a synthetic aperture radar (SAR) payload, and a hyperspectral payload. Discharge current of a certain magnitude may be generated from the battery during the satellite mission execution period.

The method may further include, when constant current of a same magnitude as the discharge current is discharged from a new battery, storing, as the first reference voltage difference, a difference between a voltage value of the new battery immediately before the discharge starts and a voltage value of the new battery when the reference time elapses after the discharge starts, and when constant current of a same magnitude as the discharge current is discharged from an aging battery, storing, as the second reference voltage difference, a difference between a voltage value of the aging battery immediately before the discharge starts and a voltage value of the aging battery when the reference time elapses after the discharge starts.

The estimating of the aging amount of the battery of the satellite may include estimating the aging amount of the battery based on a ratio of a difference between the second reference voltage difference and the sensing voltage difference with respect to a difference between the second reference voltage difference and the first reference voltage difference.

The method may further include determining whether the satellite is located in a daylight period in which sunlight is irradiated onto the satellite during the precise sensing period based on orbit information of the satellite. When the satellite is located in the daylight period during the precise sensing period, the obtaining of the first battery voltage value and the second battery voltage value and the estimating of the aging amount of the battery of the satellite may be performed.

The satellite may detect a voltage and current of the battery in a second sensing period longer than the first sensing period during a normal sensing period excluding the precise sensing period.

The battery of the satellite may include m×n battery cells that are connected in series and in parallel, where m is a number of series connections of the battery cells and n is a number of parallel connections of the battery cells. Each of the battery cells may be expressed as an equivalent circuit model including an open circuit voltage source (OCV), an ohmic resistor ($R_I$), a polarization resistor ($R_d$), and a polarization capacitor ($C_d$). The sensing voltage difference (ΔVsen) may be expressed as $\Delta Vsen/I_{mission}=(m/n)\times R_I+(1-e^{-\alpha\tau})\times\beta$, where $\beta=(m/n)\times R_d$, $\alpha=(R_d\times C_d)^{-1}$, τ is the reference time, and $I_{mission}$ is a magnitude of discharge current of a certain magnitude generated in the battery during the satellite mission execution period.

The method may further include obtaining at least one third battery voltage value of at least one time point between the first time point and the second time point based on the battery voltage data, and estimating the ohmic resistor ($R_i$), the polarization resistor ($R_d$), and the polarization capacitor ($C_d$) of the battery cell, by using the first and second battery voltages and the at least one third battery voltage.

According to an aspect of the disclosure, an apparatus for estimating an aging amount of a battery mounted on a satellite that performs a satellite mission includes a processor and a memory. The processor may be configured to receive battery voltage and current data generated by detecting a voltage and current of the battery in a preset first sensing period during a precise sensing period from the satellite and store the battery and current data in the memory, determine a mission start time point when the satellite begins to perform the satellite mission based on the battery current data, obtain a first battery voltage value of a first time point immediately before the satellite performs the satellite mission based on the battery voltage data and the mission start time point, obtain a second battery voltage of a second time point when a preset reference time elapses from the first time point based on the battery voltage data, and estimate an aging amount of the battery of the satellite based on a sensing voltage difference that is a difference between the first battery voltage value and the second battery voltage value, a first reference voltage difference, and a second reference voltage difference.

The satellite may perform the satellite mission by using a payload for capturing an image including at least one of an electro-optical (EO) payload, a synthetic aperture radar (SAR) payload, and a hyperspectral payload. Discharge current of a certain magnitude may be generated from the battery during a satellite mission execution period in which the satellite performs the satellite mission.

The memory may be configured to, when current state of a same magnitude as the discharge current is discharged from a new battery, store, as the first reference voltage difference, a difference between a voltage value of the new battery immediately before the discharge starts and a voltage value of the new battery when the reference time elapses after the discharge starts, and when constant current of a same magnitude as the discharge current is discharged from an aging battery, store, as the second reference voltage difference, a difference between a voltage value of the aging battery immediately before the discharge starts and a voltage value of the aging battery when the reference time elapses after the discharge starts.

The processor may be further configured to estimate the aging amount of the battery based on a ratio of a difference between the second reference voltage difference and the sensing voltage difference with respect to a difference between the second reference voltage difference and the first reference voltage difference.

The battery of the satellite may include m×n memory cells that are connected in series and in parallel, where m is a number of series connections of the battery cells and n is a number of parallel connections of the battery cells. Each of the battery cells may be expressed as an equivalent circuit model including an open circuit voltage source (OCV), an ohmic resistor ($R_I$), a polarization resistor ($R_d$), and a polarization capacitor ($C_d$). The sensing voltage difference (ΔVsen) may be expressed as $\Delta\Delta Vsen/I_{mission}=(m/n)\times R_I+(1-e^{-\alpha\tau})\times\beta$, where $\beta=(m/n)\times R_d$, $\alpha=(R_d\times C_d)^{-1}$, τ is the reference time, and $I_{mission}$ is a magnitude of discharge current of a certain magnitude generated in the battery during a satellite mission execution period.

The processor may be further configured to obtain at least one third battery voltage value of at least one time point between the first time point and the second time point based on the battery voltage data, and estimate the ohmic resistor ($R_I$), the polarization resistor ($R_d$), and the polarization capacitor ($C_d$) of the battery cell, by using the first and second battery voltages and the at least one third battery voltage.

Various respective aspects and features of the disclosure are defined in the appended claims. Combinations of features from the dependent claims may be combined with features of the independent claims as appropriate and not merely as explicitly set out in the claims.

One or more selected features of any one embodiment described in this disclosure may be combined with one or more selected features of any other embodiment described herein, provided that the alternative combination of features at least partially alleviates the one or more technical problem discussed in this disclosure or at least partially alleviates a technical problem discernable by one of ordinary skill in the art from this disclosure and further provided that the particular combination or permutation of embodiment features thus formed would not be understood by one of ordinary skill in the art to be incompatible.

Two or more physically distinct components in any described example implementation of this disclosure may alternatively be integrated into a single component where possible, provided that the same function is performed by the single component thus formed. Conversely, a single component of any embodiment described in this disclosure may alternatively be implemented as two or more distinct components to achieve the same function, where appropriate.

It is an aim of certain embodiments of the disclosure to solve, mitigate, or obviate, at least partly, at least one of the problems and/or disadvantages associated with the prior art. Certain embodiments aim to provide at least one of the advantages described below.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
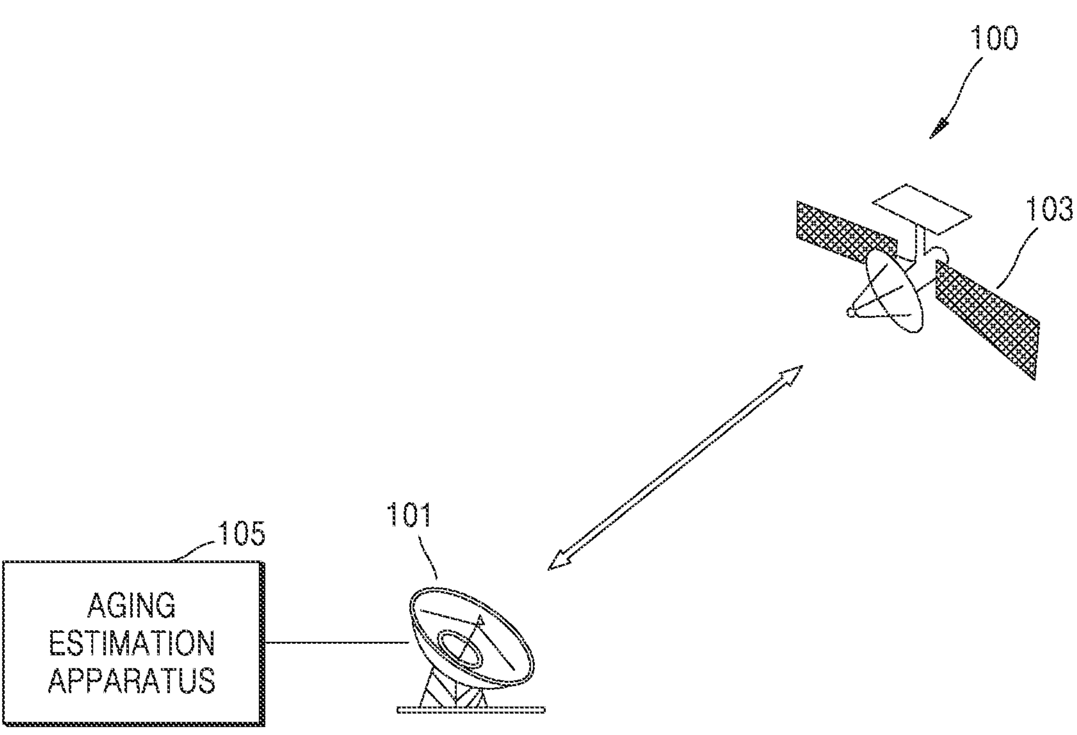
FIG. 1 is a diagram illustrating a satellite system for estimating aging of a satellite battery, according to various embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The terms used herein are for the purpose of describing certain embodiments only and are not intended to be limiting of the disclosure. An expression used in the singular may encompass the expression in the plural, unless it has a clearly different meaning in the context. Terms used herein, including technical or scientific terms, may have the same meaning as commonly understood by one of ordinary skill in the art described in the disclosure. General terms defined by dictionaries should be understood to have meanings which may be contextually understood in the art and should not have ideally or excessively formal meanings, when the terms are not defined particularly herein by the disclosure. In some cases, even terms defined in this disclosure should not be interpreted to exclude the embodiments.

In various embodiments described below, a hardware approach is described as an example. However, because various embodiments include technology using both hardware and software, various embodiments do not exclude a software-based approach.

The disclosure relates to a method and apparatus for estimating aging of a satellite battery. More particularly, the disclosure relates to a method and apparatus for estimating an aging amount of a battery mounted on a satellite that performs a satellite mission.

Hereinafter, various embodiments will be described in detail with reference to the accompanying drawings so that one of ordinary skill in the art may easily implement the disclosure. However, the disclosure is not limited to the particularly described embodiments and various modifications thereof may be made. When embodiments are described, a detailed explanation will not be given when it is determined that a detailed explanation of related well-known technology may obscure the point of the disclosure. In the drawings, the same or similar elements are denoted by the same reference numerals, and a repeated explanation thereof will not be given.

It will be understood that when an element is referred to as being "connected," the element may be directly connected or may be indirectly connected with intervening elements therebetween. It will be further understood that when a part "includes" or "comprises" an element, unless otherwise defined, the part may further include other elements, not excluding the other elements.

Some embodiments may be described by functional block components and various processing steps. Some or all of functional blocks may be implemented by various numbers of hardware and/or software components for performing certain functions. For example, the functional blocks of the disclosure may be implemented by one or more microprocessors or by circuit components for a certain function. The functional blocks of the disclosure may be implemented in various programing or scripting languages. The functional blocks of the disclosure may be implemented in an algorithm executed by one or more processors. A function performed by a functional block of the disclosure may be performed by a plurality of functional blocks, or functions performed by a plurality of functional blocks in the disclosure may be performed by one functional block. In addition, the disclosure may employ related-art techniques for electronic configuration, signal processing, and/or data processing, etc.

In the disclosure, the expression such as "greater than" or "less than" is used to determine whether a particular condition is satisfied or fulfilled, but this is only an example and the expression may not exclude the description of "equal to or greater than" or "equal to or less than". A condition described as "greater than" may be replaced with "equal to or greater than", and a condition described as "less than" may be replaced with "equal to or less than".

FIG. 1 is a diagram illustrating a satellite system for estimating aging of a satellite battery, according to various embodiments.

Referring to FIG. 1, a satellite system 100 may include a ground station 101 and a satellite 103, and the ground station 101 and the satellite 103 may wirelessly communicate with each other. The ground station 101 and the satellite 103 may transmit and receive signals related to a satellite mission through wireless communication. For example, the ground station 101 may transmit a satellite mission command to the satellite 103, and the satellite 103 may transmit satellite mission result data indicating a result of performing the satellite mission to the ground station 101.

An aging estimation apparatus 105 for determining an aging state of a battery mounted on the satellite 103 may be connected to the ground station 101 by wire or wirelessly, and the ground station 101 may assign the satellite mission to the satellite 103 by considering the aging state of the battery estimated by the aging estimation apparatus 105. According to an embodiment, the satellite system 100 includes the ground station 101, the satellite 103, and the aging estimation apparatus 105.

The ground station 101 is located on the ground, controls the satellite 103, transmits a command to assign a satellite mission to the satellite 103, receives satellite mission result data from the satellite 103, and post-processes the data. The ground station 101 may receive satellite state information indicating a state of the satellite 103, for example, a temperature of the satellite 103, the amount of power generated by a solar cell, power consumption, a battery state, and an operating state, in the form of telemetry data, and the ground station 101 may transmit a control command for adjusting the state of the satellite 103 to the satellite 103.

The ground station 101 may transmit a command signal related to a satellite mission to the satellite 103 by using a wireless communication device. The ground station 101 may control driving of the satellite 103 by using the command signal. The ground station 101 may receive satellite mission result data and state data of the satellite 103 from the satellite 103 by using a receiving device.

The satellite 103 refers to an artificial satellite orbiting a planet such as the earth. The satellite 103 may include a payload for achieving the purpose of the satellite 103, a communication module and an antenna for performing wireless communication with the ground station 101, a solar cell for generating power from sunlight, a battery for storing power, and a computing device for controlling them. The computing device includes at least one processor and at least one memory. The payload may be a payload for capturing an image, and may include at least one of, for example, an electro-optical (EO) payload, a synthetic aperture radar (SAR) payload, and a hyperspectral payload. A satellite mission in the present specification may be an image capturing mission by using a payload for capturing an image.

The satellite 103 may receive a mission command signal for instructing to perform a mission and a control command signal for controlling driving of the satellite 103 from the ground station 101. The satellite 103 may receive a mission command signal related to a mission of capturing a satellite image to observe the earth and space, and the satellite 103 may perform a mission of capturing an image of a target object according to the mission command signal from the ground station 101. When the satellite 103 receives a control command signal for controlling driving of the satellite 103 from the ground station 101, the satellite 103 may perform an operation according to the control command signal.

The satellite 103 may transmit a response signal to the ground station 101 in response to a command signal. For example, the satellite 103 may transmit satellite mission result data to the ground station 101, or may transmit satellite state data indicating a state of the satellite 103 to the ground station 101.

The satellite 103 may detect a voltage and current of a satellite battery in a preset first sensing period during a precise sensing period. The satellite 103 may detect a voltage and current of the satellite battery in a preset second sensing period during a normal sensing period excluding the precise sensing period. The first sensing period may be, for example, 100 ms. For example, the second sensing period may be, for example, 1 sec or more. During the normal sensing period, a sensing period of entire battery voltage and battery current may be 1 sec, and a sensing period of a battery cell voltage may be 4 sec. The precise sensing period may include a satellite mission execution period in which the satellite 103 performs a satellite mission. The precise sensing period may include a time period from before the satellite 103 performs a satellite mission to after the satellite mission is completed. For example, the precise sensing period may be pre-defined as a time period from 1 sec before the satellite mission execution period to 1 sec after the satellite mission execution period. The satellite 103 may determine the satellite mission execution period according to a mission command from the ground station 101, and may pre-set the precise sensing period based on the satellite mission execution period.

The aging estimation apparatus 105 is an apparatus for estimating an aging state of a battery mounted on the satellite 103. Hereinafter, the battery mounted on the satellite 103 is referred to as a satellite battery. The aging estimation apparatus 105 may obtain voltage and current data of the satellite battery through the ground station 101. The voltage and current data of the satellite battery may include a voltage value and a discharge current value of the satellite battery over time.

The aging estimation apparatus 105 may obtain information about the satellite 103 from the ground station 101. The information about the satellite 103 may include orbit information of the satellite 103, that is, location information of the satellite 103 over time. The information about the satellite 103 may include satellite mission execution plan information of the satellite 103, that is, information about when and which satellite mission the satellite 103 will perform.

The aging estimation apparatus 105 may estimate an aging state of the satellite battery by using the voltage and current data of the satellite battery and the information about the satellite 103.

Because the satellite 103 orbits the earth, for example, after being launched from the earth, it is difficult to directly estimate an aging state of the battery on the ground. The aging estimation apparatus 105 according to the disclosure may estimate an aging amount of the satellite battery by using the voltage and current data of the satellite battery received from the satellite 103. A specific method by which the aging estimation apparatus 105 estimates aging of a battery will be described in detail.

Figure 2:
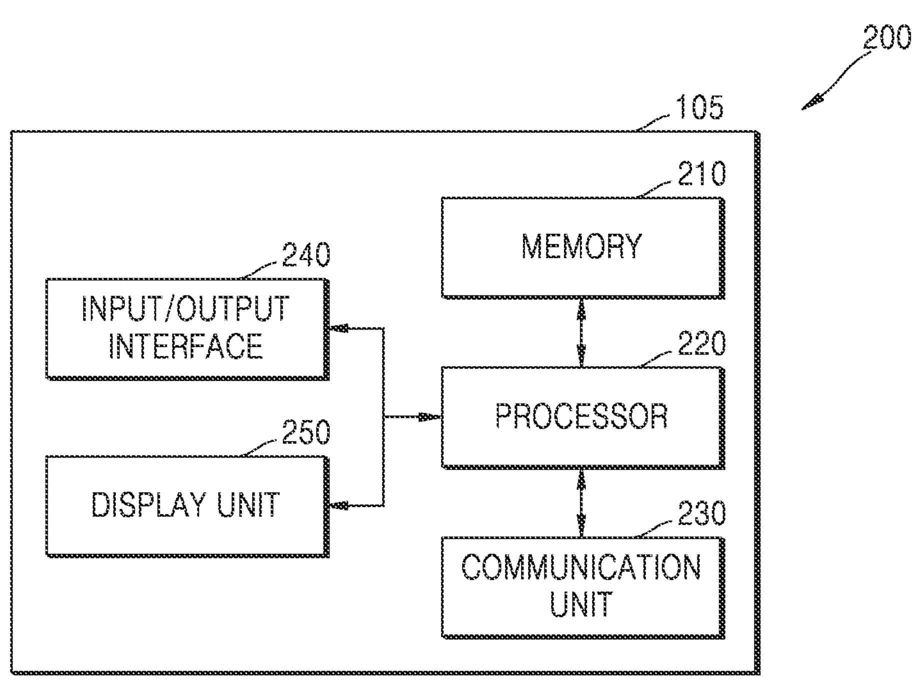
FIG. 2 is a diagram illustrating a configuration of an apparatus for estimating aging of a satellite battery, according to various embodiments.

FIG. 2 is a diagram illustrating a configuration of an apparatus for estimating aging of a satellite battery, according to various embodiments.

The term such as " . . . unit" or " . . . er" used herein indicates a unit, which processes at least one function or operation, and may be implemented by hardware or software, or by a combination of hardware and software. The aging estimation apparatus 105 may be a computing device 200 including a memory 210, a processor 220, a communication unit 230, an input/output interface 240, and a display unit 250.

The memory 210 temporarily or permanently stores data such as a basic program, an application program, and setting information for operating the aging estimation apparatus 105. The memory 210 may include a random-access memory (RAM), a read-only memory (ROM), or a permanent mass storage device such as a disk drive, but the disclosure is not limited thereto.

Software components may be loaded from a computer-readable recording medium separate from the memory 210 by using a drive mechanism. The separate computer-readable recording medium may include a computer-readable recording medium such as a floppy drive, a disk, a tape, a DVD/CD-ROM drive, and a memory card. According to an embodiment, the software components may be loaded into the memory 210 through the communication unit 230, instead of the computer-readable recording medium.

The memory 210 may provide stored data according to a request of the processor 220. According to an embodiment, the memory 210 may store voltage and current data of a satellite battery, a first reference voltage difference, and a second reference voltage difference. The voltage and current data of the satellite battery may include voltage values and current values of the battery sensed in a first sensing period during a precise sensing period. The voltage values and the current values may be stored in the memory 210 in a time-series manner, and may be stored in the memory 210 together with a sensing time.

The first reference voltage difference that is a value pre-obtained on the ground for a new battery may be, when constant current of the same magnitude as discharge current generated from the satellite battery during a satellite mission execution period is discharged from the new battery, a difference between a voltage value of the new battery immediately before the discharge starts and a voltage value of the new battery when a reference time elapses after the discharge starts.

The second reference voltage difference that is a value pre-obtained on the ground for an aging battery may be, when constant current of the same magnitude as discharge current generated from the satellite battery during the satellite mission execution period is discharged from the aging battery, a difference between a voltage value of the aging battery immediately before the discharge starts and a voltage value of the aging battery when the reference time elapses after the discharge starts. The aging battery may refer to a battery whose charging capacity is reduced to a preset ratio, for example, 70%, compared to the new battery.

The processor 220 controls overall operations of the aging estimation apparatus 105. For example, the processor 220 may control a signal to be transmitted and received through the communication unit 230. Also, the processor 220 may be configured to process a command of a computer program by performing basic arithmetic, logic, and input/output operations. The command may be provided to the processor 220 by the communication unit 230 or the memory 210. For example, the processor 220 may be configured to execute a command received according to program code stored in a recording device such as the memory 210.

The processor 220 may control the aging estimation apparatus 105 to perform operations according to various embodiments described blow. According to an embodiment, the processor 220 may determine a mission start time point based on the battery current data and battery voltage data stored in the memory 210, and may obtain a first battery voltage value of a first time point and a second battery voltage value of a second time point based on the mission start time point. The first time point may be a time immediately before the satellite performs the satellite mission, and the second time point may be a time after a preset reference time from the first time point. The processor 220 may be configured to estimate an aging amount of the satellite battery by using a sensing voltage difference that is a difference between the first battery voltage value of the first time point and the second battery voltage value of the second time point, and the first reference voltage difference and the second reference voltage difference stored in the memory 210.

The communication unit 230 performs functions for transmitting and receiving a signal through a wireless channel. All or part of the communication unit 230 may be referred to as a transmitting unit, a receiving unit, or a transmitting/receiving unit. The communication unit 230 may provide a function for performing communication between the aging estimation apparatus 105 and at least one other node through a communication network.

When the processor 220 generates a request signal according to program code stored in a recording device such as the memory 210, the request signal may be transmitted to at least one other node through the communication network under the control of the communication unit 230. Conversely, a control signal, a command, content, a file, etc. provided according to the control of a processor of at least one other node may be received by the processor 220 through the communication unit 230.

According to an embodiment, the communication unit 230 may receive voltage and current data of the satellite battery and orbit information of the satellite 103 from the ground station 101. The communication unit 230 may transmit an estimated aging amount of the satellite battery to the ground station 101 or an external device.

The input/output interface 240 may be a means for interfacing with an input/output device. In this case, the input device may be a device such as a keyboard or a mouse, and the output device may be a device such as a display unit for displaying an image. In another example, the input/output interface 240 may be a means for interfacing with a device in which input and output functions are integrated into one such as a touchscreen. In detail, when the processor 220 processes a command of a computer program loaded into the memory 210, a service screen or content may be displayed on a display through the input/output interface 240. According to an embodiment, the input/output interface 240 may include a means for interfacing with the display unit 250. The input/output interface 240 may receive a user input for a web browsing window displayed on the display unit 250, and may receive, from the processor 220, output data to be output through the display unit 250 in response to the user input. According to an embodiment, the input/output interface 240 may directly receive information for aging estimation, for example, information about the first and second reference voltage differences, from a user.

The display unit 250 indicates a display module including one or more displays. Each of the one or more displays included in the display unit 250 may individually display independent content, or one or more displays may be combined to display single content. According to an embodiment, the one or more displays included in the display unit 250 may include multiple displays that are physically separated, multiple displays that are physically combined, or displays that may divide and use one screen. According to an embodiment, the display unit 250 may display an estimated aging amount of the satellite battery to the user through at least one display.

According to other embodiments, the aging estimation apparatus 105 may include more elements than those illustrated in FIG. 2.

Figure 3:
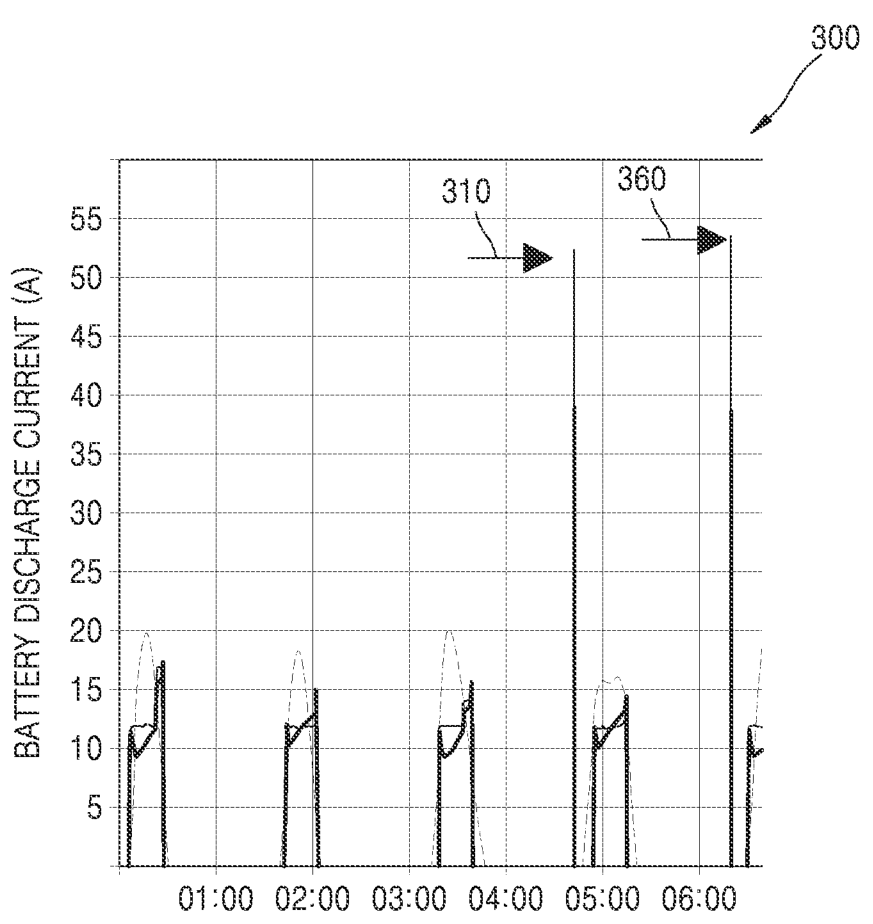
FIG. 3 is a graph illustrating discharge current of a battery mounted on a satellite, according to various embodiments.

FIG. 3 is a graph illustrating discharge current of a battery mounted on a satellite, according to various embodiments.

Referring to FIG. 3, the horizontal axis represents time, and the vertical axis represents battery discharge current.

The satellite 103 may use power stored in a battery to perform a satellite mission. A mission plan of the satellite may be pre-set, and the battery mounted on the satellite 103 discharges an amount of current required for the satellite 103 to perform the satellite mission. The battery discharges a fairly large amount of current as shown in FIG. 3 when the satellite mission is performed. That is, during a mission execution period in which the satellite 103 performs the satellite mission, discharge current of a certain large magnitude is generated in the satellite battery. In this case, the magnitude of the discharge current may be substantially constant during the mission execution period.

Referring to FIG. 3, as the satellite 103 orbits along an orbit, the satellite 103 repeatedly passes through a daylight period in which sunlight is irradiated onto the satellite 103 and an eclipse period in which sunlight is not irradiated due to the shadow of a planet. When the satellite 103 is located in the daylight period, power may be generated from solar energy, the satellite 103 may be driven by using power generated through a solar cell, and remaining power is charged in the battery of the satellite 103. Accordingly, when the satellite 103 is located in the daylight period, there is almost no current discharged from the battery.

In contrast, when the satellite 103 is located in the eclipse period, because the solar cell may not generate power, the satellite 103 is driven by using power stored in the satellite battery. Accordingly, as shown in FIG. 3, discharge current of about 10 A to about 17 A is used to drive the satellite 103. That is, in FIG. 3, a time when discharge current of about 10 A to about 17 A is discharged is a time when the satellite 103 is located in the eclipse period. Referring to FIG. 3, when the satellite 103 is a low earth orbit satellite, because a revolution period is about 2 hours, the satellite 103 passes through the eclipse period about every 2 hours and the eclipse period is about 20 to 30 minutes.

When the satellite 103 performs first and second satellite missions 310 and 360, discharge current of a considerably large magnitude, for example, about 53 A, is generated. The satellite mission may be performed when the satellite 103 is located in the daylight period or is located in the eclipse period. As described above, when the satellite mission is performed when the satellite 103 is located in the eclipse period, discharge current used to drive the satellite 103 and discharge current used for the satellite mission are combined and a certain magnitude may not be maintained at a constant level. Accordingly, according to the disclosure, an aging state of the satellite battery may be estimated by satellite battery data when the satellite mission is performed when the satellite 103 is located in the daylight period.

The satellite 103 may perform the first satellite mission 310 and the second satellite mission 360 according to the mission plan. As shown in FIG. 3, both the first satellite mission 310 and the second satellite mission 360 are performed when the satellite is located in the daylight period. When the satellite 103 performs the first satellite mission 310, first discharge current of a certain magnitude is generated. When the satellite 103 performs the second satellite mission 360, second discharge current of a certain magnitude is generated. When the first satellite mission 310 and the second satellite mission 360 are missions using the same payload, a magnitude of the first discharge current and a magnitude of the second discharge current may be substantially the same. The first satellite mission 310 and the second satellite mission k360 may be performed for a relatively short time. For example, the first satellite mission 310 and the second satellite mission 360 may be performed for only about 3 seconds to about 10 seconds.

When the first satellite mission 310 and the second satellite mission 360 are performed, large current is consumed, and discharge current of a larger magnitude than that in the eclipse period is generated as shown in FIG. 3. For example, when the first satellite mission 310 and the second satellite mission 360 are missions of capturing synthetic aperture radar (SAR) images by using an SAR, because a beam emitted from the satellite 103 should be diffusely reflected in a target area and should reach the satellite 103 again, the satellite 103 should emit a very high-intensity beam, and because the satellite 103 should emit a beam of the same intensity throughout the target area, discharge current of a fairly large magnitude is generated during the satellite mission execution period.

A magnitude and discharge time of discharge current according to the first satellite mission 310 and the second satellite mission 360 may be determined according to a target area set by a user. The aging estimation apparatus 105 uses the fact that discharge current of a fairly large magnitude is generated in the satellite battery when the satellite 103 performs the satellite mission. The aging estimation apparatus 105 may estimate an aging state of the satellite battery by using battery current and voltage data collected during the satellite mission execution period.

Figure 4:
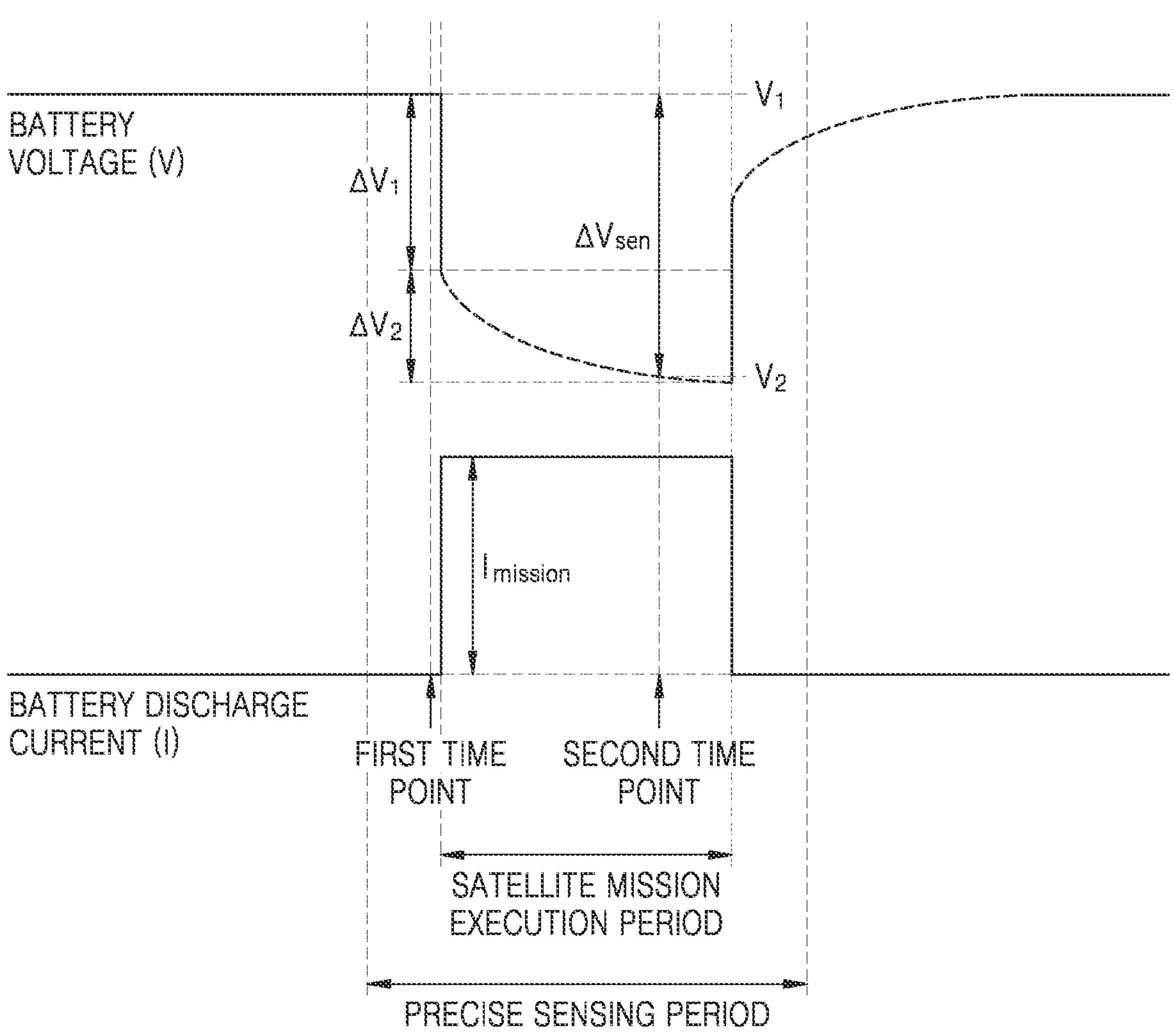
FIG. 4 is a graph illustrating voltage and current data of a battery mounted on a satellite, according to various embodiments.

FIG. 4 is a graph illustrating voltage and current data of a battery mounted on a satellite, according to various embodiments.

Referring to FIG. 4, battery discharge current $I_{mission}$ of a certain magnitude for a satellite mission is generated, during a satellite mission execution period. A precise sensing period may include the satellite mission execution period, and voltage data and discharge current data of a satellite battery may be collected in a short first sensing period during the precise sensing period. The first sensing period may be 0.1 ms.

When the discharge current $I_{mission}$ of a large magnitude is generated during the satellite mission execution period, a battery voltage V instantaneously decreases by $\Delta V_1$, and exponentially decreases by $\Delta V_2$ during the satellite mission execution period.

According to an embodiment, a mission start time point may be determined based on current data of the satellite battery collected during the precise sensing period. The mission start time point that is a time when the satellite mission execution period starts may be determined to a time when the discharge current $I_{mission}$ is generated, that is, a time when the discharge current I has a rising edge.

A first time point and a second time point may be determined based on the mission start time point. The first time point may be determined to be a time immediately before the mission start time point, that is, a last time when the discharge current I is 0 before the mission starts. The second time point may be determined to be a time when a preset reference time elapses from the first time point. The reference time may be determined to be, for example, 3 seconds. Because the satellite mission is performed for about 3 seconds when short and for about 10 seconds when long, the reference time may be pre-set so that the second time point is determined as a time before the satellite mission ends.

A battery voltage of the first time point may be determined as a first battery voltage $V_1$, and a battery voltage of the second time point may be determined as a second battery voltage $V_2$. A difference between the first battery voltage $V_1$ and the second battery voltage $V_2$ may be determined as a sensing voltage difference $\Delta V_{sen}$.

Figure 5:
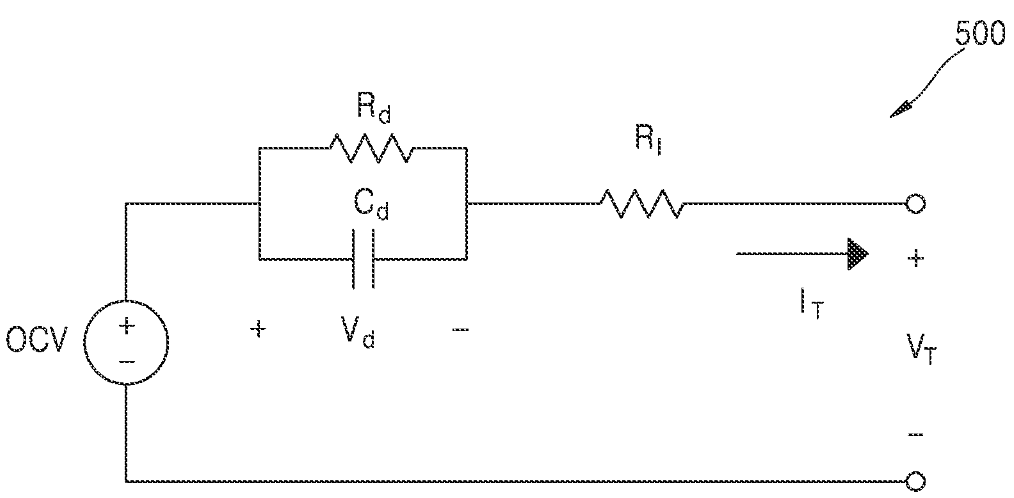
FIG. 5 illustrates an equivalent circuit model of a battery mounted on a satellite, according to various embodiments.

FIG. 5 illustrates an equivalent circuit model of a battery mounted on a satellite, according to various embodiments.

The battery mounted on the satellite may include m×n battery cells. The m×n battery cells may be connected in series and in parallel. m may be the number of series connections of the battery cells, and n may be the number of parallel connections of the battery cells. For example, m battery cells may be connected in series to constitute one cell string, and n cell strings may be connected in parallel. In another example, n battery cells may be connected in parallel to constitute a cell set, and m cell sets may be connected in series.

Each of the battery cells constituting the satellite battery may be expressed as an equivalent circuit model 500 of FIG. 5.

The equivalent circuit model 500 of the battery cell may include an open circuit voltage source OCV, an ohmic resistor $R_I$, a polarization resistor $R_d$, and a polarization capacitor $C_d$. The polarization resistor $R_d$ and the polarization capacitor $C_d$ may be connected to each other in parallel, and the polarization resistor $R_d$ and the polarization capacitor $C_d$ connected to each other in parallel may be connected to the open circuit voltage source OCV and the ohmic resistor $R_I$ in series.

In FIG. 4, $\Delta V_1$ is affected by a resistance value of the ohmic resistor $R_I$ and a magnitude of the discharge current $I_{mission}$, $\Delta V_2$ is affected by a resistance value of the polarization resistor $R_d$ and a magnitude of the discharge current $I_{mission}$, and a speed at which a battery voltage converges during the satellite mission execution period is affected by a resistance value of the polarization resistor $R_d$ and a capacitance of the polarization capacitor $C_d$.

As the battery cell ages, a resistance of the ohmic resistor $R_I$ increases, and the polarization resistor $R_d$ and the polarization capacitor $C_d$ are less affected by aging of the battery cell. That is, when the battery cell ages, $\Delta V_1$ increases and $\Delta V_2$ changes relatively little. According to the disclosure, an aging state of the satellite battery may be estimated by using the sensing voltage difference $\Delta V_{sen}$ determined by $\Delta V_1$ and $\alpha' \times \Delta V_2$.

Referring to FIG. 5, according to the equivalent circuit model 500 of the battery cell, a terminal voltage $V_T$ of the battery cell may be determined based on <Equation 1>.

$$V_T(s) = OCV(s) - I_T(s) \cdot \left( \frac{R_d}{1 + R_d \cdot C_d \cdot s} + R_I \right) \quad \text{[Equation 1]}$$

Referring to <Equation 1> expressed in an s domain, $V_T$ is a terminal voltage of the battery cell, OCV is a magnitude of an open circuit voltage, $I_T$ is a magnitude of discharge current of the battery cell, $R_d$ is a resistance value of the polarization resistor, $C_d$ is a capacitance of the polarization capacitor, and $R_I$ is a resistance value of the ohmic resistor.

The satellite battery including m×n battery cells that are connected in series and in parallel may also be expressed as an equivalent circuit model including $R_d'$, $C_d'$, and $R_I'$, and $R_d'$, $C_d'$, and $R_I'$ may be determined based on <Equation 2>.

$$R_d' = \frac{m}{n} R_d,\ C_d' = \frac{n}{m} C_d,\ R_I' = \frac{m}{n} R_I \quad \text{[Equation 2]}$$

When the first battery voltage $V_1$ of the first time point is V(0), a battery voltage at t is expressed as V(t). In this case, it is assumed that a difference between the first time point and the satellite mission start time point is close to 0. When V(0)−V(t) is ΔV, $\Delta V / I_{mission}$ may be expressed as shown in <Equation 3> in the s domain.

$$\frac{\Delta V}{I_{mission}}(s) = \frac{R_d'}{(1 + R_d' \cdot C_d' \cdot s)} + R_I' = \frac{m \cdot R_d}{n \cdot (1 + R_d \cdot C_d \cdot s)} + \frac{m}{n} R_I \quad \text{[Equation 3]}$$

Because the satellite mission execution period is relatively short, it is assumed that a magnitude of the open circuit voltage OCV during the satellite mission execution period is negligibly small.

When <Equation 3> is converted into a time domain, the battery voltage V(t) at t may be expressed as follows.

$$V(t) = V(0) - \left\{ \frac{m}{n} R_I + (1 - e^{-\alpha t})\beta \right\} \cdot I_{mission} \quad \text{[Equation 4]}$$

Here, $\alpha = (R_d \times C_d)^{-1}$, and $\beta = (m/n) \times R_d$.

Accordingly, the sensing voltage difference ΔVsen may be expressed as shown in <Equation 5>.

$$\frac{\Delta V_{sen}}{I_{mission}} = \frac{V_2 - V_1}{I_{mission}} = \frac{V(T) - V(0)}{I_{mission}} = \frac{m}{n} R_I + (1 - e^{-\alpha T})\beta \quad \text{[Equation 5]}$$

Here, τ is a time between the first time point and the second time point, that is, a reference time. Here, $$\frac{m}{n} R_I$$

corresponds to $\Delta V_1$, and $(1-e^{-\alpha\tau})\beta$ corresponds to $\alpha' \times \Delta V_2$. That is, $(1-e^{-\alpha\tau})$ corresponds to α', and β corresponds to $\Delta V_2$. Also, as described above, a magnitude of the discharge current $I_{mission}$ does not change much when the same type of satellite mission is performed, and is constant even during the satellite mission execution period.

τ is a preset reference time and thus is constant, and α is determined by the polarization resistor $R_d$ and the polarization capacitor $C_d$ that are less affected by aging of the satellite battery and thus α does not change much even when the satellite battery ages.

The aging estimation apparatus 105 may estimate aging of the satellite battery, based on the sensing voltage difference $\Delta V_{sen}$. The aging estimation apparatus 105 may estimate an aging amount of the satellite battery according to <Equation 6> based on the sensing voltage difference $\Delta V_{sen}$, the first reference voltage difference $\Delta V_1$, and the second reference voltage difference $\Delta V_2$.

$$\text{Aging} = \frac{\Delta V2 - \Delta V_{sen}}{\Delta V2 - \Delta V1} \quad \text{[Equation 6]}$$

The first reference voltage difference $\Delta V_1$ may be pre-determined by a test or the like on the ground, and may be, when constant current of the same magnitude as the discharge current $I_{mission}$ generated from the battery during the satellite mission execution period is discharged from a new battery, a difference between a voltage value of the new battery immediately before the discharge starts and a voltage value of the new battery when the reference time τ elapses after the discharge starts.

The second reference voltage difference $\Delta V_2$ may be pre-determined by a test or the like on the ground, and may be, when constant current of the same magnitude as the discharge current $I_{mission}$ generated from the battery during the satellite mission execution period is discharged from an aging battery, a difference between a voltage value of the aging battery immediately before the discharge starts and a voltage value of the aging battery when the reference time τ elapses after the discharge starts.

The aging estimation apparatus 105 may collect the sensing voltage differences $\Delta V_{sen}$ by performing the satellite mission several times. According to an embodiment, in order to determine aging of the battery, the aging estimation apparatus 105 may collect the sensing voltage differences $\Delta V_{sen}$ whenever the satellite mission is performed over several days, may calculate an average of the collected sensing voltage differences $\Delta V_{sen}$, and may estimate an aging amount of the satellite battery by using the calculated average value.

The aging estimation apparatus 105 according to the disclosure may obtain the sensing voltage difference $\Delta V_{sen}$ whenever the satellite 103 performs the mission, and may estimate aging of the satellite battery by using the sensing voltage difference $\Delta V_{sen}$.

According to another embodiment, the aging estimation apparatus 105 may obtain at least one third battery voltage value of at least one time point between the first time point and the second time point based on battery voltage data. The aging estimation apparatus 105 may obtain a plurality of third battery voltage values of a plurality of third time points between the first time point and the second time point based on the battery voltage data.

The aging estimation apparatus 105 may estimate the ohmic resistor $R_I$, the polarization resistor $R_d$, and the polarization capacitor $C_d$, by using the first and second battery voltages and the at least one third battery voltage by using <Equation 4>. The aging estimation apparatus 105 may estimate an aging state of the satellite battery by comparing an ohmic resistance of the new battery with an ohmic resistance of the aging battery.

Figure 6:
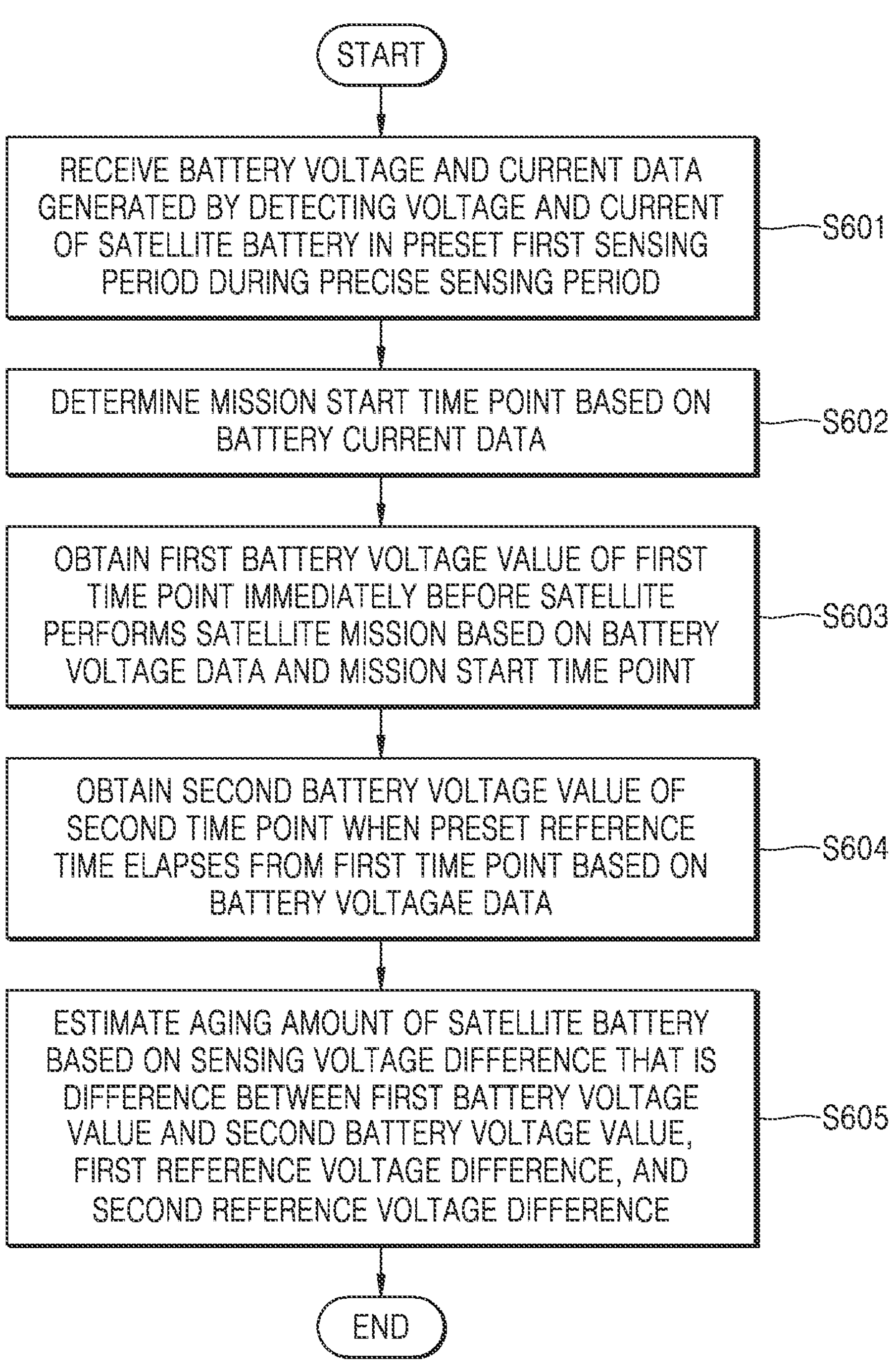
FIG. 6 is a flowchart for describing a method of estimating aging of a battery mounted on a satellite, according to various embodiments.

FIG. 6 is a flowchart for describing a method of estimating aging of a battery mounted on a satellite, according to various embodiments.

The method of estimating aging of the satellite battery according to the flowchart of FIG. 6 may be performed by the computing device 200 of FIG. 2. The satellite battery is a battery mounted on a satellite that performs a satellite mission.

Referring to FIG. 6, the computing device 200 may receive battery voltage and current data generated by detecting a voltage and current of a satellite battery in a preset first sensing period during a precise sensing period (S601). The precise sensing period may include a satellite mission execution period in which a satellite performs a satellite mission. The satellite may detect a voltage and current of the battery in a second sensing period during a normal sensing period, and the second sensing period of the normal sensing period may be longer than the first sensing period of the precise sensing period. The first sensing period may be, for example, 100 ms. The battery voltage and current data may include voltage data and current data of the satellite battery, the voltage data may include voltage values that are arranged in a time-series manner, and the current data may also include discharge current values that are arranged in a time-series manner. The battery voltage and current data may include a time at which the voltage values and the current values of the satellite battery are sensed.

The computing device 200 may determine a mission start time point when the satellite begins to perform the satellite mission based on the current data of the satellite battery (S602). The satellite may perform the satellite mission by using a payload for capturing an image including at least one of an electro-optical (EO) payload, a synthetic aperture radar (SAR) payload, and a hyperspectral payload. When the satellite performs the satellite mission, discharge current of a certain magnitude may be generated from the satellite battery, and a magnitude of the discharge current may be constant during a satellite mission execution period. The computing device 200 may determine a time point when a current value suddenly increases to a certain magnitude or more as the mission start time point based on the current data.

The computing device 200 may obtain a first battery voltage value of a first time point immediately before the satellite performs the satellite mission based on the voltage data of the satellite battery and the mission start time point (S603). The mission start time point is a time point determined in operation S602.

The computing device 200 may obtain a second battery voltage value of a second time point when a preset reference time elapses from the first time point based on the voltage data of the satellite battery (S604). The reference time may be, for example, 3 seconds.

The computing device 200 may determine a sensing voltage difference that is a difference between the first battery voltage value of the first time point and the second battery voltage value of the second time point, and may estimate an aging amount of the satellite battery based on the sensing voltage difference, a first reference voltage difference, and a second reference voltage difference (S605). The computing device 200 may estimate an aging amount of the satellite battery according to <Equation 6> based on the sensing voltage difference $\Delta V_{sen}$, the first reference voltage difference $\Delta V_1$, and the second reference voltage difference $\Delta V_2$.

The first reference voltage difference $\Delta V_1$ may be pre-stored as a pre-calculated value for a new battery, and the second reference voltage difference $\Delta V_2$ may be pre-stored as a pre-calculated value for an aging battery.

According to another embodiment, the computing device 200 may determine whether the satellite is located in a daylight period during a precise sensing period based on orbit information of the satellite, and when the satellite is located in the daylight period during the precise sensing period, may obtain the first battery voltage value and the second battery voltage value and may estimate an aging amount of the satellite battery by using the first and second battery voltage values. That is, the computing device 200 may not estimate an aging amount of the satellite battery based on voltage and current data of the satellite battery generated due to the satellite mission performed when the satellite is located in an eclipse period.

An apparatus and method according to various embodiments may estimate aging of a satellite battery.

An apparatus and method according to various embodiments may estimate an aging amount of a battery mounted on a satellite that performs a satellite mission.

An apparatus and method according to various embodiments may estimate an equivalent model parameter of a battery mounted on a satellite that performs a satellite mission.

The effects according to the disclosure are not limited thereto, and throughout the specification it will be clearly appreciated by one of ordinary skill in the art that there may be other effects unmentioned.

Methods according to the claims or the embodiments described herein may be implemented by hardware, software, or a combination of hardware and software.

When the methods are implemented by software, a computer-readable storage medium storing one or more programs (software modules) may be provided. The one or more programs stored in the computer-readable storage medium are configured to be executed by one or more processors in an electronic device. The one or more programs include instructions for allowing the electronic device to execute the methods according to the claims or the embodiments.

The programs (e.g., software modules or software) may be stored in a random-access memory (RAM), a non-volatile memory including flash memory, a read-only memory (ROM), an electrically erasable programmable read-only memory (EEPROM), a magnetic disc storage device, compact disc-ROM (CD-ROM), a digital versatile disc (DVD), another type of optical storage device, or a magnetic cassette. Alternatively, the programs may be stored in a memory including any combination of some or all of the above storage media. Also, a plurality of constituent memories may be provided.

The programs may also be stored in an attachable storage device which is accessible through a communication network such as the Internet, an intranet, a local area network (LAN), a wide area network (WAN), or a storage area network (SAN), or a combination thereof. Such a storage device may be connected, via an external port, to an apparatus for performing an embodiment. Also, a separate storage device on a communication network may be connected to an apparatus for performing an embodiment.

In the afore-described embodiments, elements included in the disclosure are expressed in a singular or plural form according to specific embodiments. However, singular or plural representations are selected appropriately for the sake of convenience of explanation, the disclosure is not limited to the singular or plural elements, and even expressed as a singular element, it may be composed of plural elements, and vice versa.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope of the disclosure as defined by the following claims.

What is claimed is:

1. A method of estimating an aging amount of a battery, performed by a processor, mounted on a satellite that performs a satellite mission, wherein the satellite comprises the battery, the processor, a memory accessible by the processor, and an imaging payload for performing the satellite mission, the imaging payload including at least one of EO (Electro Optical), SAR (Synthetic Aperture Radar), and Hyperspectral payloads, and the battery outputs a discharge current of a predetermined magnitude while performing the satellite mission, the method comprising:

storing, in the memory, a first reference voltage difference as a difference between a voltage value of a new battery immediately before discharge starts and a voltage value of the new battery at a time point when a preset reference time elapses after discharge starts, when a constant current of the same magnitude as the discharge current is discharged from the new battery;

storing, in the memory, a second reference voltage difference as a difference between a voltage value of an aged battery immediately before discharge starts and a voltage value of the aged battery at a time point when the preset reference time elapses after discharge starts, when the constant current of the same magnitude as the discharge current is discharged from the aged battery;

receiving battery voltage and current data generated by detecting a voltage and current of the battery at intervals of a preset first sensing period during a precise sensing period that includes a period in which the satellite mission is performed;

determining a mission start time point when the satellite begins to perform the satellite mission based on the battery current data;

obtaining a first battery voltage value of a first time point immediately before the satellite performs the satellite mission based on the battery voltage data and the mission start time point;

obtaining a second battery voltage value of a second time point when the preset reference time elapses from the first time point based on the battery voltage data;

estimating the aging amount of the battery of the satellite based on a sensing voltage difference between the first battery voltage value and the second battery voltage value, the first reference voltage difference, and the second reference voltage difference, wherein the sensing voltage difference is obtained from battery discharge occurring during actual performance of the satellite mission without performing a separate battery discharge test; and detecting the voltage and current of the battery at intervals of a second sensing period longer than the first sensing period during a general sensing period that does not include the period in which the satellite mission is performed.

2. The method of claim 1, wherein the estimating of the aging amount of the battery of the satellite comprises estimating the aging amount of the battery based on a ratio of a difference between the second reference voltage difference and the sensing voltage difference with respect to a difference between the second reference voltage difference and the first reference voltage difference.

3. The method of claim 1, further comprising determining whether the satellite is located in a daylight period in which sunlight is irradiated onto the satellite during the precise sensing period based on orbit information of the satellite, wherein, when the satellite is located in the daylight period during the precise sensing period, the obtaining of the first battery voltage value and the second battery voltage value and the estimating of the aging amount of the battery of the satellite are performed.

4. The method of claim 1, wherein the battery of the satellite comprises m×n battery cells that are connected in series and in parallel, where m is a number of series connections of the battery cells and n is a number of parallel connections of the battery cells, wherein each of the battery cells is expressed as an equivalent circuit model comprising an open circuit voltage source (OCV), an ohmic resistor ($R_I$), a polarization resistor ($R_d$), and a polarization capacitor ($C_d$), wherein the sensing voltage difference (ΔVsen) is expressed as $\Delta Vsen/I_{mission}=(m/n)\times R_I+(1-e^{-\alpha\tau})\times\beta$, where $\beta=(m/n)\times R_d$, $\alpha=(R_d\times C_d)^{-1}$, $\tau$ is the preset reference time, and $I_{mission}$ is a magnitude of discharge current of a certain magnitude generated in the battery during the satellite mission execution period.

5. The method of claim 4, further comprising:

obtaining at least one third battery voltage value of at least one time point between the first time point and the second time point based on the battery voltage data; and estimating the ohmic resistor ($R_i$), the polarization resistor ($R_d$), and the polarization capacitor ($C_d$) of the battery cell, by using the first and second battery voltages and the at least one third battery voltage.

6. An apparatus for estimating an aging amount of a battery mounted on a satellite that performs a satellite mission, wherein the satellite comprises the battery, and an imaging payload for performing the satellite mission, the imaging payload including at least one of EO (Electro Optical), SAR (Synthetic Aperture Radar), and Hyperspectral payloads, and the battery outputs a discharge current of a predetermined magnitude while performing the satellite mission, the apparatus comprising:

a processor; and a memory accessible by the processor, wherein the processor is configured to:

store, in the memory, a first reference voltage difference as a difference between a voltage value of a new battery immediately before discharge starts and a voltage value of the new battery at a time point when a preset reference time elapses after discharge starts, when a constant current of the same magnitude as the discharge current is discharged from the new battery;

store, in the memory, a second reference voltage difference as a difference between a voltage value of an aged battery immediately before discharge starts and a voltage value of the aged battery at a time point when the preset reference time elapses after discharge starts, when the constant current of the same magnitude as the discharge current is discharged from the aged battery;

receive, from the satellite, battery voltage and current data generated by detecting a voltage and current of the battery at intervals of a preset first sensing period during a precise sensing period that includes a period in which the satellite mission is performed, and store the battery and current data in the memory, determine a mission start time point when the satellite begins to perform the satellite mission based on the battery current data, obtain a first battery voltage value of a first time point immediately before the satellite performs the satellite mission based on the battery voltage data and the mission start time point, obtain a second battery voltage of a second time point when the preset reference time elapses from the first time point based on the battery voltage data, estimate an aging amount of the battery of the satellite based on a sensing voltage difference that is a difference between the first battery voltage value and the second battery voltage value, the first reference voltage difference, and the second reference voltage difference, wherein the sensing voltage difference is obtained from battery discharge occurring during actual performance of the satellite mission without performing a separate battery discharge test, and receive, from the satellite, battery voltage and current data generated by detecting the voltage and current of the battery at intervals of a second sensing period longer than the first sensing period during a general sensing period that does not include the period in which the satellite mission is performed.

7. The apparatus of claim 6, wherein the processor is further configured to estimate the aging amount of the battery based on a ratio of a difference between the second reference voltage difference and the sensing voltage difference with respect to a difference between the second reference voltage difference and the first reference voltage difference.

8. The apparatus of claim 6, wherein the battery of the satellite comprises m×n memory cells that are connected in series and in parallel, where m is a number of series connections of the battery cells and n is a number of parallel connections of the battery cells, wherein each of the battery cells is expressed as an equivalent circuit model comprising an open circuit voltage source (OCV), an ohmic resistor ($R_I$), a polarization resistor ($R_d$), and a polarization capacitor ($C_d$), wherein the sensing voltage difference ($\Delta Vsen$) is expressed as $\Delta Vsen/I_{mission}=(m/n)\times R_I+(1-e^{-\alpha\tau})\times\beta$, where $\beta=(m/n)\times R_d$, $\alpha=(R_d\times C_d)^{-1}$, $\tau$ is the preset reference time, and $I_{mission}$ is a magnitude of discharge current of a certain magnitude generated in the battery during a satellite mission execution period.

9. The apparatus of claim 8, wherein the processor is further configured to obtain at least one third battery voltage value of at least one time point between the first time point and the second time point based on the battery voltage data, and estimate the ohmic resistor ($R_i$), the polarization resistor ($R_d$), and the polarization capacitor ($C_d$) of the battery cell, by using the first and second battery voltages and the at least one third battery voltage.

* * * * *